(12) United States Patent
Klee et al.

(10) Patent No.: US 7,235,472 B2
(45) Date of Patent: Jun. 26, 2007

(54) METHOD OF MAKING FULLY SILICIDED GATE ELECTRODE

(75) Inventors: Veit Klee, Pleasant Valley, NY (US); Sun-Oo Kim, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 175 days.

(21) Appl. No.: 10/988,113

(22) Filed: Nov. 12, 2004

(65) Prior Publication Data

US 2006/0105557 A1 May 18, 2006

(51) Int. Cl.
*H01L 21/3205* (2006.01)
(52) U.S. Cl. .......... 438/592; 438/655; 257/E21.203
(58) Field of Classification Search .......... 438/592, 438/655, 664, 976; 257/E21.203
See application file for complete search history.

(56) References Cited

U.S. PATENT DOCUMENTS

| 5,550,084 | A | 8/1996 | Anjum et al. |
| 5,981,365 | A | 11/1999 | Cheek et al. |
| 6,080,648 | A * | 6/2000 | Nagashima .......... 438/592 |
| 6,284,612 | B1 | 9/2001 | Wu |
| 6,348,390 | B1 | 2/2002 | Wu |
| 6,365,468 | B1 | 4/2002 | Yeh et al. |
| 6,555,453 | B1 | 4/2003 | Xiang et al. |
| 6,562,718 | B1 | 5/2003 | Xiang et al. |
| 6,579,784 | B1 | 6/2003 | Huang |
| 6,586,332 | B1 | 7/2003 | Lee |
| 6,787,845 | B2 | 9/2004 | Deleonibus |
| 2001/0003056 | A1 | 6/2001 | Hashimoto et al. |
| 2001/0041398 | A1 | 11/2001 | Angello et al. |
| 2002/0197805 | A1 | 12/2002 | Kwon et al. |
| 2003/0042551 | A1 | 3/2003 | Agnello et al. |

FOREIGN PATENT DOCUMENTS

| EP | 0 908 935 A1 | 4/1999 |
| WO | WO 2004/057659 A1 | 7/2004 |

OTHER PUBLICATIONS

Alshehri, T., et al., "Development Of A Full Silicidation of (FUSI) Process For Nickel Silicide," 22nd Annual Microelectronic Engineering Conference, May 2004, pp. 52-56.

(Continued)

*Primary Examiner*—Chandra Chaudhari
(74) *Attorney, Agent, or Firm*—Slater & Matsil, L.L.P.

(57) ABSTRACT

A method of making a semiconductor device for an integrated circuit chip. An interim gate electrode stack formed includes a top silicon portion patterned from a second silicon layer, a sandwiched oxide portion patterned from an etch stop oxide layer, and a bottom silicon portion patterned from a first silicon layer formed on a gate dielectric layer over a substrate. Etching the second silicon layer is stopped at the etch stop oxide layer. A spacer structure is formed about the interim gate electrode stack, and then the top silicon portion and the sandwiched oxide portion are removed. The spacer structure height may be reduced. A metal layer is formed over the bottom silicon portion of the interim gate electrode stack and over source and drain regions of the substrate, all of which are silicided at the same time to form a fully silicided (FUSI) gate electrode and silicided source and drain regions.

46 Claims, 6 Drawing Sheets

OTHER PUBLICATIONS

Brown, G., et al., "Scaling CMOS: materials & devices," Materials Today, ISSN: 1369 7021, Jan. 2004, pp. 20-25.

Cho, B., et al., "HfSi Gate Electrode With Tunable Work Function for Advanced CMOS Devices," www.eng.nus.edu.sq/Eresnews/ 0406, ISSN 0217-7870, Jun. 2004.

* cited by examiner

METHOD OF MAKING FULLY SILICIDED GATE ELECTRODE

TECHNICAL FIELD

The present invention generally relates to the fabrication of semiconductor devices in integrated circuit chips. In one aspect it relates more particularly to a fully silicided gate electrode and methods of making the same.

BACKGROUND

As technology progresses and higher switching speeds are sought, the physical size of semiconductor devices continues to decrease. For some time metal gates were the norm for metal-oxide-semiconductor (MOS) devices. Early MOS devices often had metal gate electrodes made from aluminum or alloys of aluminum. Aluminum was preferred for its ease of deposition and etching, its favorable adhesion to $SiO_2$ and Si surfaces, and its lack of corrosion issues. However, aluminum had some downsides, such as electromigration and spiking into shallow junctions. The downsides were often overcome by alloying aluminum with copper or silicon. However, as multiple levels of metal interconnects at the back-end-of-the-line, aluminum and aluminum alloys were not able to withstand the high thermal budgets needed for deposition and annealing of intermetal dielectrics due to aluminum's low melting and alloying temperatures.

In the early 1970's, doped polysilicon gate electrodes began to be used. This also lead to complementary-MOS (CMOS) technology that provided the ability to tailor the work function of the gate electrode for negative-channel MOS (NMOS) and positive-channel MOS (PMOS) devices. The work function of the gate electrode did not require a lot of attention in the design because the threshold voltage for the device depended more upon other factors, such as substrate doping, gate oxide charge, and gate oxide thickness. And because operating voltages were high relative to today's standards for high-speed logic devices, the gate electrode was not as critical in the control of the threshold voltage setting.

Scaling down the physical size of semiconductor devices continued due to technical and economic factors. For example, the output or drive current of a device available to switch its load devices increases linearly as its physical channel length decreases. Also, the current required by load devices to achieve switching decreases as their gate area and physical channel length decreases. Because the drive current requirement to switch the load devices depends, at least in part, on the total load capacitance and area, there is also a strong motivation to reduce the size of the complete device, not only its physical channel length. And economically, it is desirable to increase the number of devices yielded from each wafer, which further drives the device dimensions smaller. But as device dimensions decrease, new technical issues arise.

Doped polysilicon gate electrodes are now being found to be inadequate compared to metal silicided gates. Transistor physical gate length (or channel length) is reaching a point where doping levels in polysilicon can no longer be increased sufficiently to support the electrical potential profiles desired. In CMOS devices where the polysilicon gate electrode is doped with an opposite conductivity type than the channel in the substrate, there is a tendency for the gate electrode to deplete and invert when the device is biased into substrate inversion for operation. Any depletion of the polysilicon surface at the gate dielectric acts as an additional dielectric region, which increases the equivalent oxide thickness (EOT) of the gate dielectric. A push to increase boron concentrations in the polysilicon gate dielectric to minimize depletion, together with the trend of thinning the gate dielectric, has lead to increased boron diffusion through the gate dielectric and into the channel of the PMOS device. This alters the threshold voltage in an uncontrollable and undesirable way.

As a result of the recent issues with traditional doped polysilicon gate electrodes discussed above (at least in part), there has been a return to the use of metal gate electrodes in the form of metal silicided gate electrodes, especially in dual-work function gate electrodes. Fully silicided (FUSI) gate electrodes are often preferred because the interim silicon gate electrode structure may not need to be doped prior to silicidation and because a FUSI gate electrode behaves more like a metal gate electrode.

However, there are already many well established processes in place for making semiconductor devices with doped polysilicon gate electrodes. Thus, it would be highly desirable to have a process that integrates the formation a FUSI gate electrode with minimal changes to the current process flow used to make devices with a doped polysilicon gate electrode.

It is also often desirable to silicide the source and drain regions of a device. Hence, it would be further desirable to able to silicide the gate electrode while siliciding the source and drain regions, but without having to completely redesign the current process flow used for making devices with a doped polysilicon gate electrode.

SUMMARY OF THE INVENTION

The problems and needs outlined above may be addressed by embodiments of the present invention. In accordance with one aspect of the present invention, a method of forming a fully silicided gate electrode for a semiconductor device is provided. This method includes the following steps described in this paragraph. The order of the steps may vary, may be sequential, may overlap, may be in parallel, and combinations thereof. A first silicon layer is formed on a gate dielectric layer. The gate dielectric layer being formed on a substrate. An etch stop oxide layer is formed on the first silicon layer. A second silicon layer is formed on the etch stop oxide layer. The second silicon layer is etched and patterned to form a top silicon portion of an interim gate electrode stack. The top silicon portion has a top portion gate length dimension. The etching of the second silicon layer is stopped at the etch stop oxide layer. Portions of the etch stop oxide layer not covered by the patterned second silicon layer are removed to expose at least part of the first silicon layer, to form a patterned stop oxide layer under the patterned second silicon layer, and to form a sandwiched oxide portion of interim gate electrode stack. The first silicon layer is etched and patterned to form a bottom silicon portion of the interim gate electrode stack and to complete the formation of the interim gate electrode stack. The bottom silicon portion has a bottom portion gate length dimension. The bottom portion gate length is about the same as the top portion gate length. Hence, the interim gate electrode stack includes the sandwiched oxide portion located between the top silicon portion and the bottom silicon portion. A spacer structure is formed about the interim gate electrode stack. After forming the spacer structure, etching is performed to remove the top silicon portion of the interim gate electrode stack. The etching to remove the top silicon portion is stopped at the sandwiched oxide portion of the interim gate electrode stack. The sandwiched oxide portion of the interim gate electrode stack is removed. A metal layer is formed over the bottom silicon portion of the interim gate electrode stack. The metal layer is formed over selected source and drain regions of the substrate. The bottom silicon portion of the interim gate electrode stack is silicided using the metal layer to form the fully silicided gate electrode. The selected source and drain regions of the substrate are silicided using the metal layer while siliciding the bottom silicon portion of the interim gate electrode stack. The first silicon layer preferably has a thickness selected so that the bottom silicon portion of the interim gate electrode stack is fully silicided at about the same time as a desired silicide thickness is formed in selected source and drain regions of the substrate.

In accordance with another aspect of the present invention, a method of making an integrated circuit chip including forming fully silicided gate electrodes is provided. This method includes the following steps described in this paragraph. The order of the steps may vary, may be sequential, may overlap, may be in parallel, and combinations thereof. A first layer of silicon is formed on a gate dielectric layer. The gate dielectric layer is formed over a substrate. An etch stop oxide layer is formed on the first silicon layer. A second layer of silicon is formed on the etch stop oxide layer. A patterned mask is formed over the second silicon layer. The second silicon layer is etched and patterned in alignment with the patterned mask. The etching of the second silicon layer is stopped at the etch stop oxide layer. Portions of the etch stop oxide layer not covered by the patterned second silicon layer are removed to expose at least part of the first silicon layer and to form a patterned etch stop oxide layer under the patterned second silicon layer. The first silicon layer is etched and patterned in alignment with the patterned second silicon layer to form a set of interim gate electrode stacks comprising at least part of the patterned second silicon layer, at least part of the patterned etch stop oxide layer, and at least part of the patterned first silicon layer. A spacer structure is formed about each of at least some of the interim gate electrode stacks. After the forming of the spacer structure, the patterned second silicon layer is etched to remove it, and this etching is stopped at the patterned etch stop oxide layer. The patterned etch stop oxide layer is removed. A metal layer is formed over a top surface of the patterned first silicon layer and over selected source and drain regions of the substrate. The portions of the patterned first silicon layer in the interim gate electrode stacks are silicided using the metal layer to form the fully silicided gate electrodes. The selected source and drain regions of the substrate are silicided using the metal layer while siliciding the portions of the patterned first silicon layer in the interim gate electrode stacks.

In accordance with yet another aspect of the present invention, a method of making an integrated circuit chip including forming fully silicided gate electrodes is provided. This method includes the following steps described in this paragraph. The order of the steps may vary, may be sequential, may overlap, may be in parallel, and combinations thereof. A first layer of silicon is formed on a gate dielectric layer. The gate dielectric layer is formed over a substrate. An etch stop oxide layer is formed on the first silicon layer. A second layer of silicon is formed on the etch stop oxide layer. A patterned mask is formed over the second silicon layer. The second silicon layer is etched and patterned in alignment with the patterned mask. The etching of the second silicon layer is stopped at the etch stop oxide layer. Portions of the etch stop oxide layer not covered by the patterned second silicon layer are removed to expose at least part of the first silicon layer and to form a patterned etch stop oxide layer under the patterned second silicon layer. The first silicon layer is etched and patterned in alignment with the patterned second silicon layer to form a set of interim gate electrode stacks comprising at least part of the patterned second silicon layer, at least part of the patterned etch stop oxide layer, and at least part of the patterned first silicon layer. A spacer structure is formed about each of at least some of the interim gate electrode stacks. Selected source and drain regions of the substrate are implanted in alignment with the spacer structure. Part of the spacer structure is removed to reduce the height of the spacer structure such that at least part of the patterned second silicon layer of the interim gate electrode stacks extends above the spacer structure. A blanket mask layer is formed over the substrate. A portion of the blanket mask layer is removed so that a top surface of the patterned second silicon layer is exposed. The patterned second silicon layer is etched and removed, and this etching is stopped at the patterned etch stop oxide layer. The blanket mask layer is removed. The patterned etch stop oxide layer is removed. A metal layer is formed on a top surface of the patterned first silicon layer and on the source and drain regions of the substrate. The portions of the patterned first silicon layer in the interim gate electrode stacks are silicided using the metal layer to form the fully silicided gate electrodes. The selected source and drain regions of the substrate are silicided using the metal layer while siliciding the portions of the patterned first silicon layer in the interim gate electrode stacks. The metal layer is removed.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
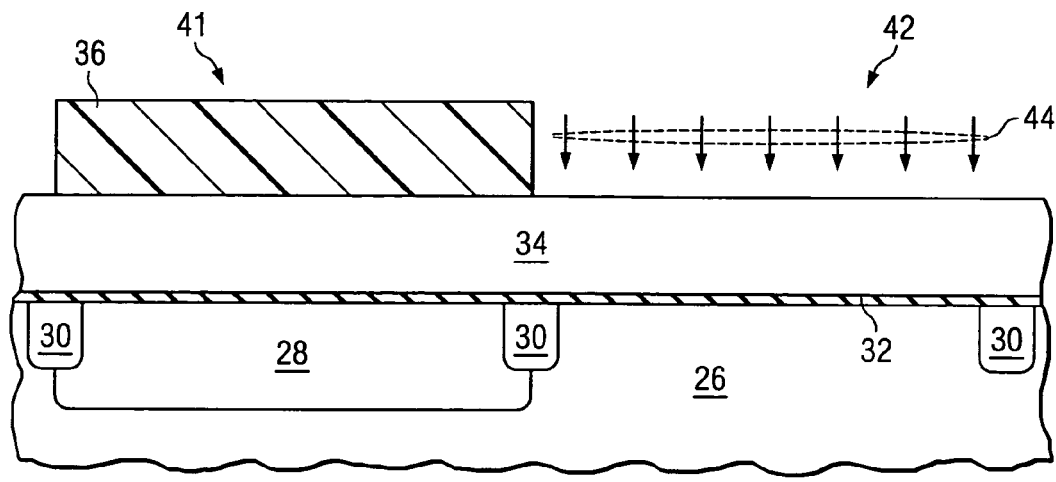
FIGS. 1-6 show some illustrative steps for a convention process flow of forming transistors.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a method of making semiconductor devices for an integrated circuit chip where the semiconductor devices have fully silicided (FUSI) gate electrodes. As will be shown and described herein, and as may be highly desirable, an embodiment of the present invention may be integrated into an existing process flow that is already being used for making semiconductor devices having doped polysilicon gate electrodes, with minimal changes. With reference to FIGS. 1-6, some steps of a conventional process flow for making two transistors 20 (e.g., NMOS and PMOS transistors) with doped polysilicon gate electrodes 22 are described. And, FIGS. 7-17 show an example application where an embodiment of the present invention is integrated into the conventional process flow of FIGS. 1-6 to form FUSI gate electrodes 72.

First, the conventional process flow example of FIGS. 1-6 will be described briefly. Next, the illustrative embodiment of the present invention shown in FIGS. 7-17 will be described. In describing the invention embodiment example of FIGS. 7-17, various aspects of the embodiment will be related to and compared to the conventional flow example of FIGS. 1-6 to show the integration benefits of the embodiment. Other advantages, benefits, and alternatives provided by an embodiment of the present invention will be described as well.

Referring now to FIG. 1, an intermediate step of making two transistors using a conventional process flow is shown. In FIG. 1, the substrate 26 already has a well region 28 formed therein, which may be N-type or P-type. The substrate 26 of FIG. 1 also has shallow trench isolation regions 30 already formed therein to isolate the devices. A gate dielectric layer 32 and a polysilicon gate electrode layer 34 are formed on the substrate 26 in FIG. 1. Also in FIG. 1, a patterned photoresist layer 36 is formed over the first transistor site 41 so that the polysilicon gate electrode layer 34 over the second transistor site 42 may be selectively doped by implanting. The arrows 44 in FIG. 1 represent the ions (e.g., boron or phosphorus) being implanted into the polysilicon gate electrode layer 34.

Figure 2:
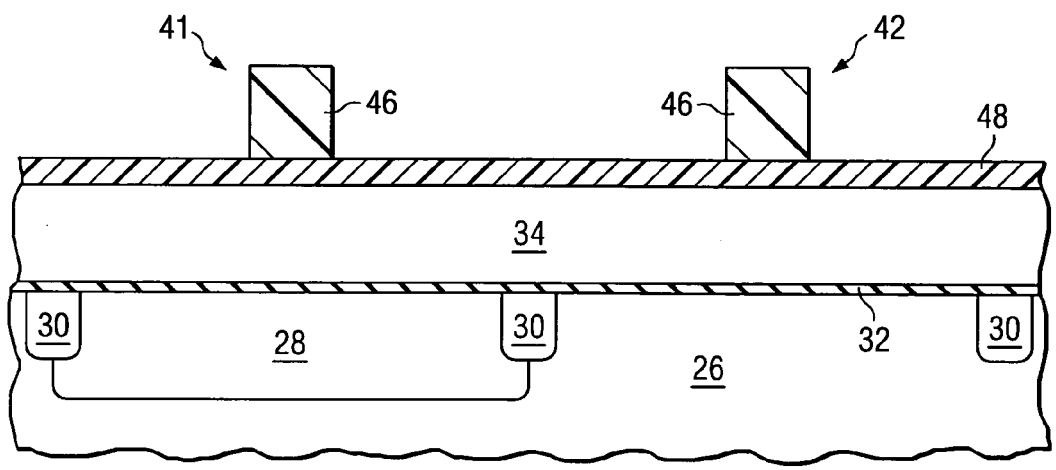
Figure 3:
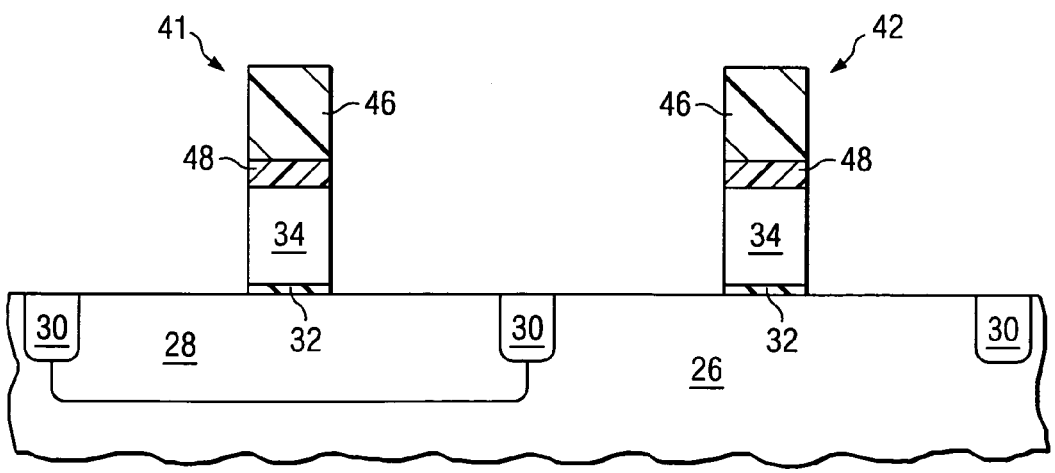
Figure 4:
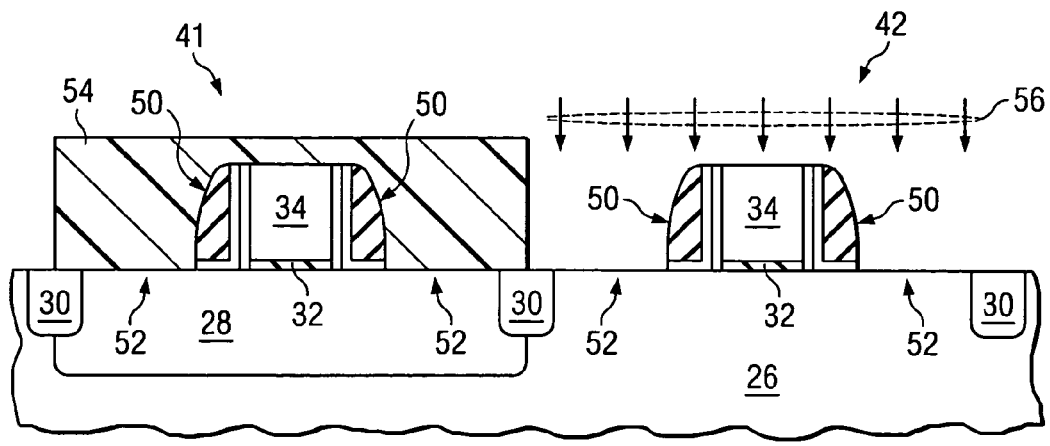

In FIG. 2, the photoresist mask 36 of FIG. 1 has been removed, and another photoresist mask 46 is formed on a tetra ethyl oxysilane (TEOS) layer 48. In this example, the patterned photoresist layer 46 is used as a soft mask, and the TEOS layer 48 will be used as a hard mask. In alternative to using TEOS, other materials also may be used for a hard mask, such as $Si_3N_4$, other nitrides, and other oxides, for example. The photoresist mask 46 in FIG. 2 is for forming the gate electrodes 22. In FIG. 3, the TEOS layer 48 has been pattern to form a hard mask, which was then used to etch and pattern the polysilicon material 34 for forming the gate electrodes 22. Between FIGS. 3 and 4, many well known steps are omitted, including the removal of the photoresist mask 46 and the TEOS hard mask 48. In FIG. 4, a complex spacer structure 50 is formed about each of the polysilicon gate electrodes 22. Various implants of doping for the source and drain regions 52 (e.g., HALO implant, lightly-doped regions) may have been performed after various stages of forming the spacer structures 50. A photoresist mask 54 is shown in FIG. 4 covering the first transistor site 41 while the second transistor site 42 is being implanted (see arrows 56).

Figure 5:
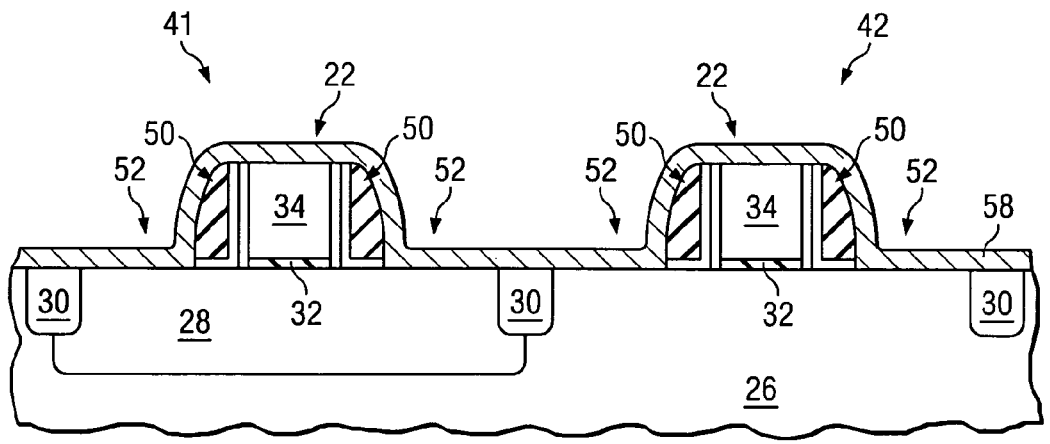

After the doping of the polysilicon gates 22 and the source and drain regions 52 of the substrate 26, a metal layer 58 is formed over the intermediate structure, as shown in FIG. 5.

Figure 6:
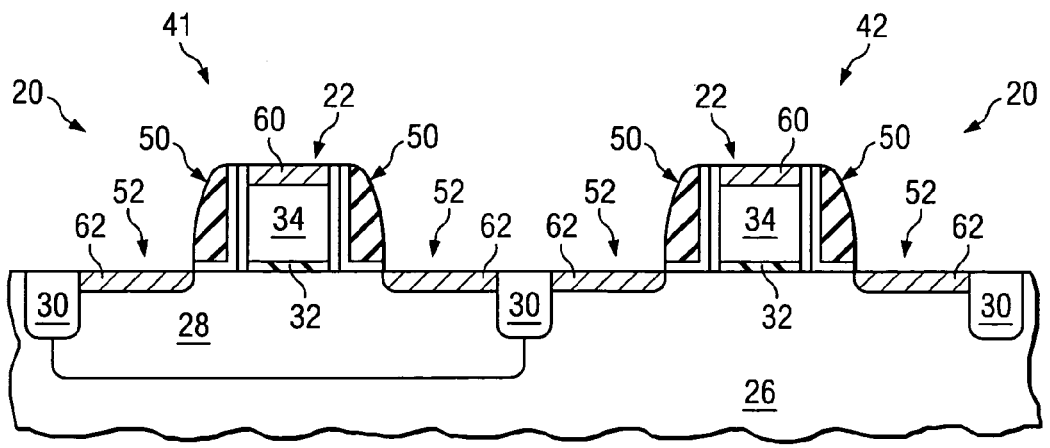

In this example, the metal layer 58 is nickel. In other embodiments, cobalt, titanium, or alloys thereof, for example, may be used for the metal layer 58. This metal layer 58 will be used for siliciding the top of the gate electrodes 22 and the top of the source and drain regions 52, as shown in FIG. 6. In FIG. 6, the remainder of the metal layer 58 (not consumed in the silicidation) has been removed. Thus, two transistors 20 are formed in FIG. 6, each having a doped polysilicon gate electrode 22 with a silicided top portion 60, and each having source and drain regions 52 with a silicided top portion 62. In this example process flow of FIGS. 1-6, the gate electrodes 22 and the source and drain regions 52 are silicided at the same time. The simultaneous silicidation of these portions is most preferred, rather than siliciding them separately. Such preference regarding the silicidation will be discussed further below.

Figure 7:
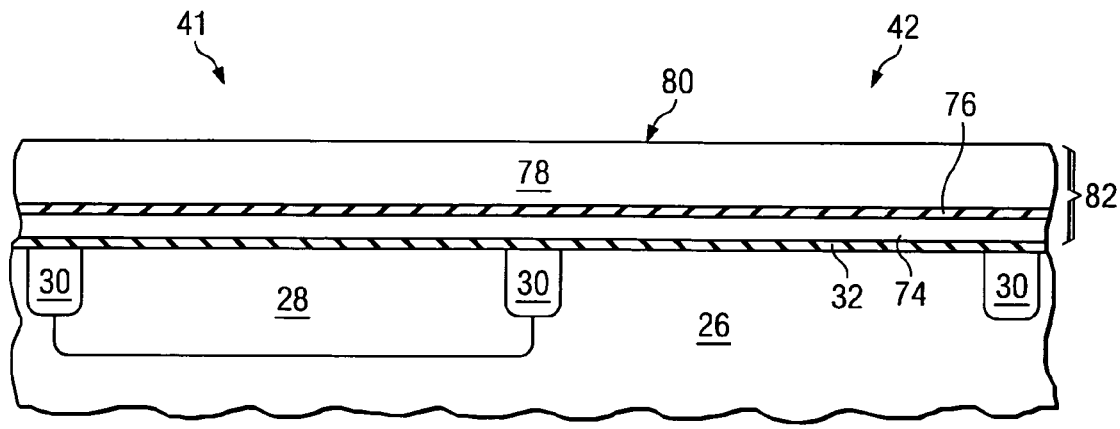
FIGS. 7-17 show an example process flow of an illustrative embodiment of the present invention for forming transistors having fully-silicided gate electrodes.

Referring now to FIGS. 7-17, a method of making transistors 70 with FUSI gate electrodes 72 in accordance with an illustrative embodiment of the present invention will be described next. In FIG. 7, the substrate 26 is the same as that of FIG. 1, in that the substrate 26 has a well region 28 (may be N-type or P-type) and shallow trench isolation regions 30 formed therein. As is well known to those of ordinary skill in the art, there may be N-type and P-type wells, stacked wells (e.g., triple well), and the substrate 26 may be N-type and/or P-type, for example. Furthermore, the substrate 26 of an embodiment may have any suitable materials and structure, currently known (e.g., SOI, deep N-well, deep P-well, buried insulator, strained channel, SiGe, etc.) or later developed. Also, the isolation regions 30 may be formed using any known or later developed process, may have any suitable shape, and may be any suitable type (e.g., shallow trench isolation, FOX, thermally grown, deep trench isolation), as needed or desired.

Also as in FIG. 1, a gate dielectric layer 32 is formed over the substrate 26 in FIG. 7. The gate dielectric layer 32 in an embodiment may be made from any suitable material(s), may be formed using any known or later developed process, and may be a single layer, a stacked dielectric structure, a composite structure, or combinations thereof, for example. Furthermore, the physical thickness and the equivalent oxide thickness (EOT) of the gate dielectric layer 32 may be any known or later developed thickness.

In FIG. 7, a first layer of silicon material 74 is formed on the gate dielectric layer 32. In this embodiment, the first silicon layer 74 is made of polycrystalline silicon (also know as poly or polysilicon), for example. In other embodiments, the first silicon layer 74 may be made of another type of silicon (e.g., single crystal, nanocrystalline, amorphous, or some combination thereof). An etch stop oxide layer 76 is formed on the first silicon layer 74, and a second silicon layer 78 is formed on the etch stop oxide layer 76 (see FIG. 7). The etch stop oxide layer 76 is a silicon oxide (e.g., $SiO_2$) in this example. In other embodiments, however, the etch stop oxide layer 76 may be any suitable material, preferably with a good etch selectivity to silicon, for example. In this embodiment, the second silicon layer 78 is also made of polycrystalline silicon. In other embodiments, the second silicon layer 78 may be made of another type of silicon (e.g., single crystal, nanocrystalline, amorphous, or some combination thereof). Also, the second silicon layer 78 need not be the same material as the first silicon layer 74, but it is preferred that they are the same material (e.g., for ease of manufacturing).

The stack 80 shown in FIG. 7 (first silicon layer 74, etch stop oxide layer 76, and second silicon layer 78) may be formed in-situ in a same tool, which would be preferred in many cases. Forming the stack 80 in-situ may be performed using the following steps, for example; 1) deposit the first silicon layer 74 in a chemical vapor deposition (CVD) furnace using low pressure CVD (LPCVD) (for providing good temperature control and throughput); 2) add $O_2$ into the furnace at a slightly higher temperature to form a thin native oxide ($SiO_2$) (i.e., the etch stop oxide layer 76) on the first silicon layer 74; and 3) return parameters to that used to form the first silicon layer 74 for forming the second silicon layer 78 in the furnace. Each of these steps individually may be well known and well controlled processing steps. This is advantageous because the formation of the stack 80 requires minimal changes to the conventional process of forming a polysilicon gate material (see e.g., layer 34 in FIG. 1). Any tool(s) or process(es) may be used to form the stack 80 in other embodiments. Typically, a fabrication facility will already have the tool(s) needed to implement an embodiment of the present invention and no retooling will be needed, which is another advantage that may be realized in implementing an embodiment of the present invention.

Comparing the process of the invention embodiment with the conventional process, the difference of process flow begins with the deposition of the gate electrode material (see FIGS. 1 and 7). Hence, the approach of this embodiment is to use a conventional polysilicon flow and the existing polysilicon tooling, but having a stack 80 of thin poly (first silicon layer 74), thin oxide (etch stop oxide layer 76), and relatively thick poly (second silicon layer 78), as shown in FIG. 7. Typically, the second silicon layer 78 will be thicker than the first silicon layer 74, but may not need to be in some cases. The stack 80 shown in FIG. 7 may have an overall thickness 82 that is about the same or slightly less than that of the conventional polysilicon gate electrode layer 34 shown in FIG. 1, for example. This allows for the embodiment of the present invention to be more easily integrated into the conventional process flow with minimal changes.

Figure 8:
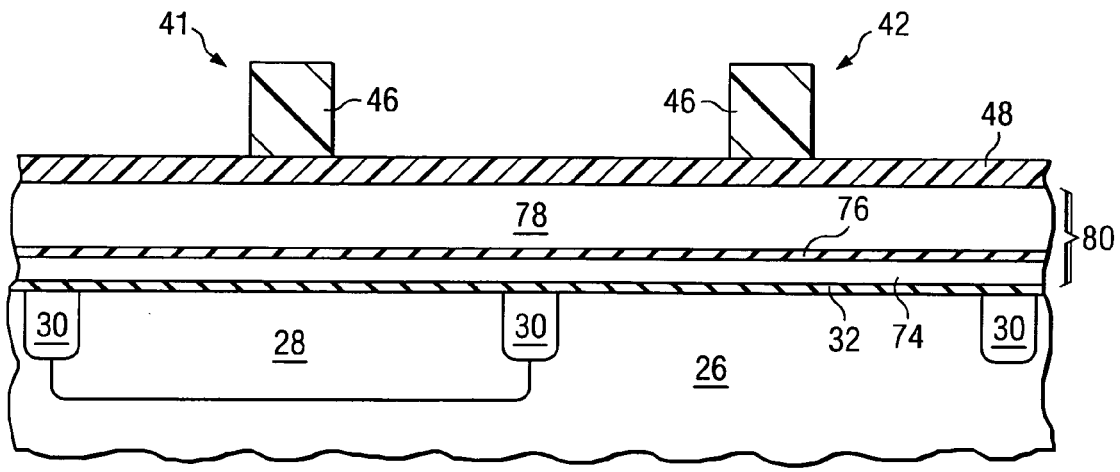

In FIG. 8, a patterned photoresist layer 46 is formed as a soft mask over a TEOS layer 48, which will be used as a hard mask. This masking scheme is used in this embodiment to be the same as the conventional process (see e.g., FIG. 2). However, any suitable masking scheme or process may be used in an embodiment of the present invention. For example, the TEOS layer 48 or TEOS hard mask may be eliminated and only a soft mask (e.g., photoresist 46) may be sufficient. Preferably, the conventional masking process already in place for use in patterning the polysilicon gate electrode 22 may be used. Hence, the lithography process need not be changed to implement an embodiment of the present invention, which is yet another advantage.

Figure 9:
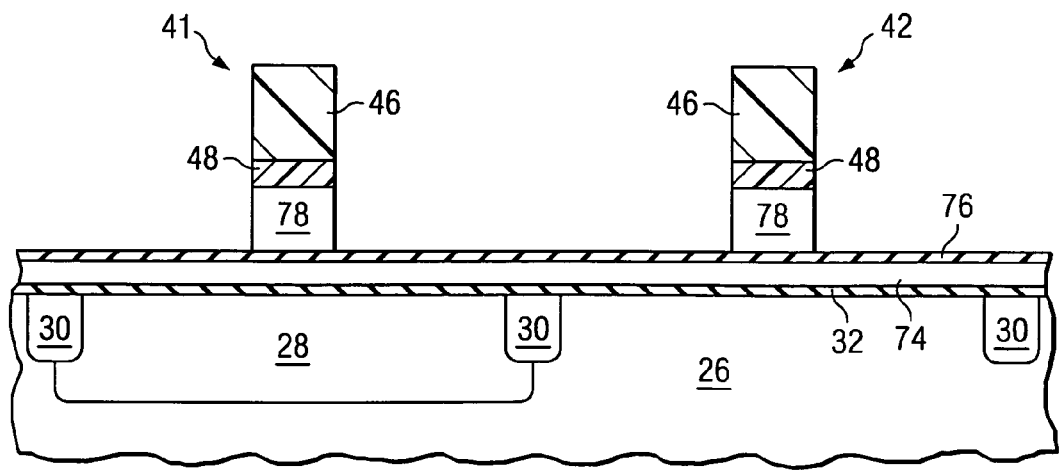

In FIG. 9, the TEOS hard mask 48 has been patterned. Using the TEOS hard mask 48 in this embodiment, the second silicon layer 78 is etched and patterned, as shown in FIG. 9. This etching of the second silicon layer 78 is stopped at the etch stop oxide layer 76. Using commonly known etch chemistries and etching processes (e.g., reactive-ion etching (RIE)), silicon oxide has a relatively high etch selectivity to silicon. In fact, stopping on silicon oxide while etching silicon is one of the best controlled etching processes with one of the highest etch selectivities. It is a very self limiting process relative to other processes due to the high etch selectivity. Thus, a standard gate polysilicon etching and patterning process may be used for this step.

Due to the desire to obtain a fully-silicided gate electrode while simultaneously siliciding the source and drain regions, a relatively thin silicon gate electrode is used. In other approaches to obtaining a FUSI gate electrode while simultaneously siliciding the source and drain regions, a relatively thick non-silicon hard mask is used (as opposed to the poly/oxide/poly stack 80 provided by an embodiment of the present invention). Such relatively thick non-silicon hard mask is often needed when the polysilicon gate electrode is relatively thin to prevent implanting of the channel (through the gate electrode) during implanting of the source and drain regions. However, it is difficult to etch through a thick non-silicon hard mask (e.g., nitride) and stop on a very thin polysilicon gate electrode with high controllability and accuracy. Thus, an embodiment of the present invention has an advantage over other FUSI gate forming processes by using an oxide (layer 76) as an etch stop while etching through silicon (layer 78). Also, note that the conventional process may be already set up to etch polysilicon and stop on an oxide (see e.g., FIG. 3). Hence, the tooling for etching the second silicon layer 78 is probably readily available and currently being used in a convention process, requiring few changes to use such tooling for an embodiment of the present invention.

After the second silicon layer 78 is etched and patterned (see FIG. 9), the remaining portions of the etch stop oxide layer 76 not covered by the patterned second silicon layer 78 may be easily removed (e.g., using a wet etch or cleaning step). With the etch stop oxide layer 76 patterned in alignment with the patterned second silicon layer 78, part of the first silicon layer 74 (not covered by the patterned second silicon layer 78) is exposed.

Yet another benefit of an embodiment of the present invention is that the etch stopping on the etch stop oxide layer 76 of the stack 80 (see FIG. 9) provides a very well defined, thin silicon layer (first silicon layer 74) with an accurately controlled thickness. Hence, the first silicon layer 74 may be etched and patterned with a relatively short etch time. This greatly lessens the risk of etching through a very thin gate dielectric layer 32 (if not desired to do so). Generally, the thinner a polysilicon layer is, the easier it is to control the etch stopping point (e.g., using an end point signal to control the stopping point) because the percent error has less effect on the process. For example, etching through 120 nm of polysilicon with a 10% error in stopping point may end with a 12 nm offset, whereas etching through a 20 nm thick layer of polysilicon with the same 10% error may only have a 2 nm offset. One of the downsides of a conventional process, where a relatively thick polysilicon gate electrode material 34 (e.g., 1000-1200 angstroms) is etched (see e.g., FIG. 3), is that it is difficult to accurately stop on a very thin gate dielectric layer 32. Thus, an advantage of an embodiment of the present invention may be that the thicker silicon etch is performed on a portion (the second silicon layer 78) where less precision is needed.

Another disadvantage of the conventional process in the case where the polysilicon gate electrodes 22 are doped differently (for NMOS and PMOS devices), is that the differently doped polysilicon gate electrodes 22 etch at different rates making end point control of the etch stopping problematic and difficult to control. This problem becomes more profound as the thickness of the polysilicon gate electrode 22 is increased. Thus, by having relatively thin gate electrodes, this problem can be lessened. A FUSI gate electrode 72 may be doped or undoped. In some cases of FUSI gate electrodes 72, it may not be needed or desired to dope the gate electrodes 72, which may save one or more steps. In the case where the gate electrodes are not doped prior to forming a FUSI gate electrode 72, the uneven etching among gate electrodes may not be an issue at all because the gate electrodes (for NMOS and PMOS devices) are all the same. Therefore, the sum of these factors is that it may be easier overall to handle and control the etching of the gate electrode material using an embodiment of the present invention.

The etch stop oxide layer 76 may be very thin and in most cases will not need to be more than about 10 angstroms thick. In an actual application, a practical range for the thickness of the etch stop oxide layer 76 may be about 10 angstroms to about 50 angstroms, for example. The preferred thickness of the first silicon layer 74 may be in a range of about 200 angstroms (20 nm) to about 300 angstroms (30 nm), for example. The thickness of the first silicon layer 74 may be determined by the desired thickness of the silicide 62 on the source and drain regions 52 at the end of the silicide process (see e.g., FIG. 17), as will be discussed further below.

The preferred thickness of the second silicon layer 78 may be in a range of about 500 angstroms (50 nm) to about 700 angstroms (70 nm), for example. In most applications, the second silicon layer 78 will be thicker than the first silicon layer 74. One reason that it may be desirable or needed to have a relatively thick second silicon layer 78 is to prevent implanting of the channel 84 beneath the gate electrode during implanting of the source and drain regions 52 (see e.g., FIG. 11, described further below). While implanting the source and drain regions 52, if the overall stack height is not large enough, the implanting may go through the interim gate electrode stack 90 and into the channel region 84 there below.

Figure 10:
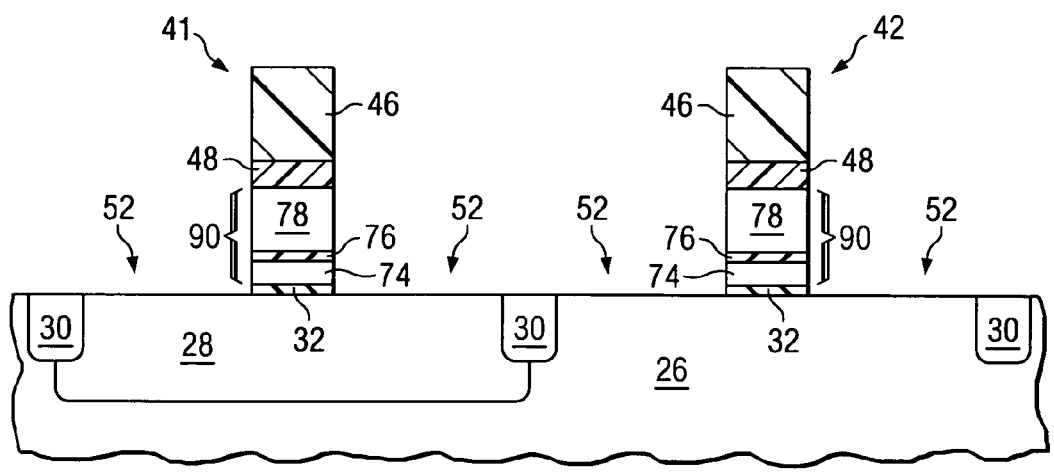

At FIG. 10, the interim gate electrode stack 90 is formed for each transistor site 41, 42. The interim gate electrode stack 90 includes a top silicon portion 78 (patterned from the second silicon layer 78), a bottom silicon portion 74 (patterned from the first silicon layer 74), and a sandwiched oxide layer 76 (patterned from the etch stop oxide layer 76) located between the top silicon portion 78 and the bottom silicon portion 74.

Figure 11:
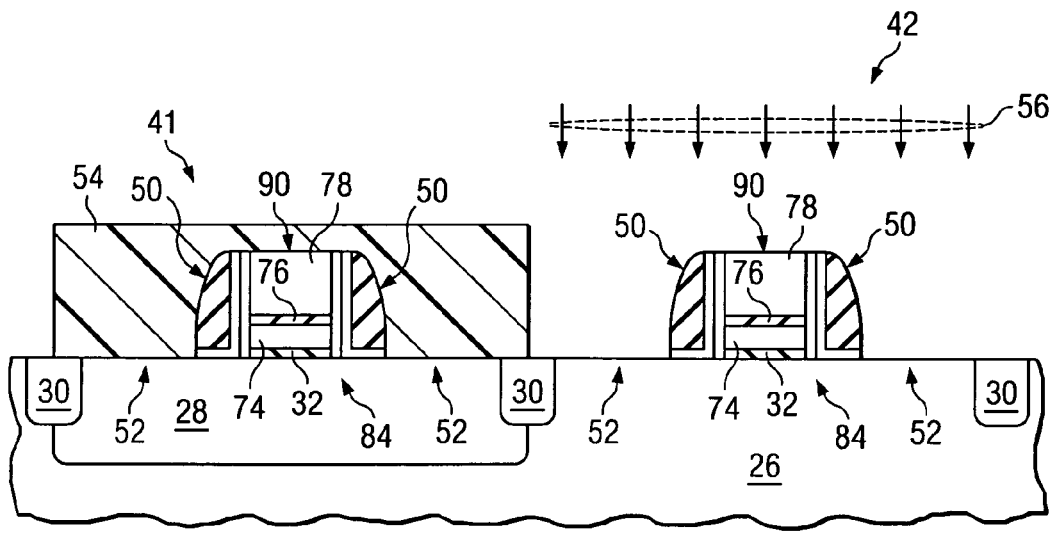

Between FIGS. 10 and 11, several steps (which may be well known steps) are not shown for purposes of simplifying the figures, including: removing the photoresist mask 46; removing the TEOS mask 48; implanting or doping source and drain regions 52; forming a spacer structure 50 about the interim gate electrode stacks 90, and forming and removing photoresist masks (some not shown) for implanting.

The overall thickness 82 of the stack 80 (see FIG. 7) may have a preferred thickness of less than about 1000 angstroms, and may be in a range of about 800 angstroms to about 900 angstroms in a typical application, for example. The stack 80 shown in FIG. 7 may have an overall thickness 82 that is about the same or slightly less than that of the conventional polysilicon gate electrode layer 34 shown in FIG. 1. In addition to preventing implanting of the channel region 84, there are also other benefits of having a stack 80 with a similar height to that of a conventional polysilicon gate electrode layer 34, such as for spacer formation.

Comparing FIGS. 4 and 11 shows that the conventional process and the process of the invention embodiment may merge together again at this point. From a practical point of view, it is preferred to have the interim gate electrode stack 90 with a thickness about the same as that of the convention process flow (see e.g., FIG. 4) so that the processes for implanting the source and drain regions 52 using complex spacer sequences (see e.g., FIG. 4), which have already been developed and tweaked, may be used while implementing an embodiment of the present invention (see FIG. 11). The spacer structure 50 of an embodiment may be formed of one ore more spacer portions of one or more suitable spacer materials. Also, having a sufficient height for the stack 90 aids in the formation of the spacer structure(s). Generally a certain height is needed for the spacer structure(s) to prevent implants from penetrating through the spacer structure 50, as their main function is typically for blocking implanting ions. Typically spacers are self forming to the top of a gate electrode in a conventional process. Thus, if the same height is used for the stack 90 of an embodiment as was used in a conventional process, the same process for forming the spacer structure 50 may be used. This is yet another advantage of implementing an embodiment of the present invention for forming a FUSI gate electrode 72 (i.e., easier integration of the new method). Minimizing changes to the conventional process is often more economical, more predicable, and faster for integration.

Furthermore, the steps of implanting the source and drain regions 52, which involves the formation of the spacer structure 50, is typically equally critical and has significant effect on the characteristics of the resulting device than the formation of the gate electrode. This is yet another reason to avoid having to change the processes of implanting the source and drain regions 52 for implementing a new gate electrode design. Hence, an advantage of the implementing an embodiment of the present invention to form a FUSI gate electrode is that the device will not need to be redesigned (with respect to the spacer formation and the source and drain implanting) to obtain an improved gate electrode.

Although a certain spacer structure 50 is shown in this embodiment (see FIG. 11), this merely one example spacer structure among many. Any suitable spacer structure(s) (currently known or later developed) may be implement or used in an embodiment of the present invention.

Figure 12:
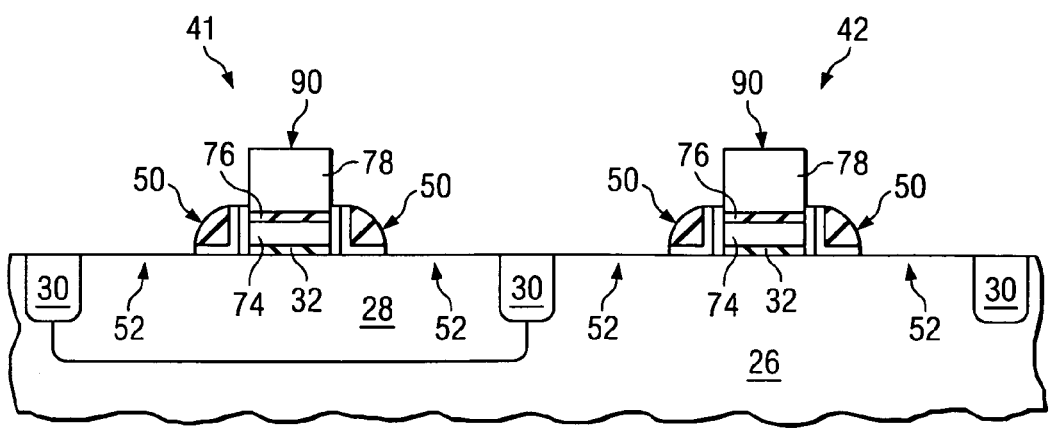

At FIG. 12, e.g., after the implanting of the source and drain regions 52, the process flow of the invention embodiment again deviates from the convention process flow. At FIG. 16, the process flow of the invention embodiment will again merge with the conventional process flow (see FIG. 5). In FIG. 12, part of the spacer structure 50 has been pulled down. This pulling down of spacer structure 50 may be done (or to some extent) inherently during the process(es) of implanting the source and drain regions 52. The implanting sometimes affects the etch selectivity of the spacer material(s), and thus there is often some inherent spacer pull down (e.g., photoresist removal, at cleaning steps). An alteration to the cleaning chemicals or cleaning steps may be used to cause lesser or greater spacer pull down, as desired or needed. Also, a thin screening oxide (not shown) may be formed over the spacer structure 50 before implanting to protect the surface of the spacer structure 50, if desired or needed to control the amount of spacer pull down.

In a preferred embodiment, as shown in FIG. 12, the height of the spacer structure 50 is reduced so that the spacer structure 50 is just above the bottom portion 74 of the interim gate electrode stack 90. In other embodiments, however, part or all of the spacer structure 50 may be completely removed. It is preferred to leave the spacer structure 50 in place so that the later siliciding step may be a self-aligned siliciding process. Also, in other embodiments, the spacer structure height may not be reduced at all or there may be no additional step added for an embodiment of the present invention to reduce or further reduce (if inherently reduced) the height of the spacer structure 50. If a step is implemented for an embodiment of the present invention specifically to pull down the height of the spacer structure 50, as is preferred, such step may be any suitable process (e.g., cleaning process added or altered) or etching (e.g., RIE, wet etch, dry etch). Such pull down process or etching will be highly dependent on the materials used for the spacer structure 50. One of the reasons that it may be preferred to reduce the height of the spacer structure 50 for an embodiment is for providing a more uniform application of the metal layer 58 for silicidation. This is discussed further below regarding the formation of the metal layer 58 for silicidation while describing FIG. 16. Furthermore, the spacer structure height may be reduced to a height below the top surface of the bottom silicon portion 74. Therefore, whether a spacer structure pull down step is added or included, and the resulting height of the spacer structure 50 prior to forming the metal layer 58 for silicidation (see e.g., FIG. 16), are optional for an embodiment of the present invention.

Figure 13:
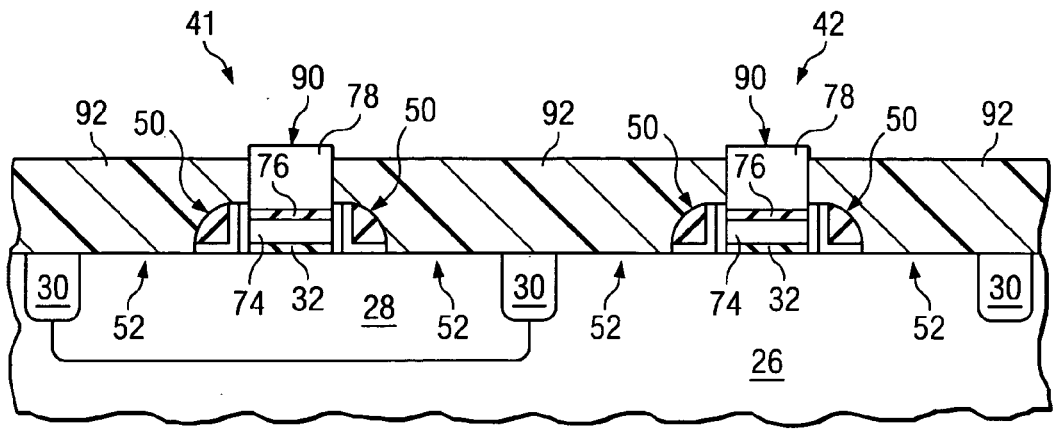
Figure 14:
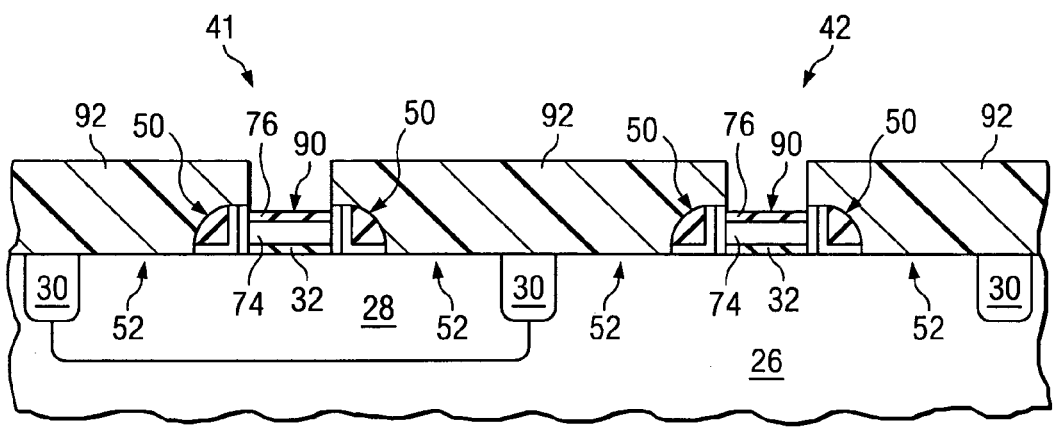

In FIG. 13, a blanket mask layer 92 is formed over the substrate. Initially, the blanket mask layer 92 may cover or partially cover the top silicon portion 78 of the interim gate electrode stack 90. In such case, a portion of the blanket mask layer 92 is removed so that at least a top surface of the top silicon portion 78 is exposed. The blanket mask layer 92 may be etched back, for example. The top silicon portion 78 of the interim gate electrode stack 90 needs to be exposed for the next step of removing the top silicon portion 78, as shown in FIG. 14. One of the purposes of the blanket mask layer 78 is to cover the substrate 26 while removing the top silicon portion 78 (see FIG. 14).

The blanket mask layer 92 is preferably made from a spin-on material (e.g., photoresist) for several reasons. First, spin-on material is often very self leveling. Thus, a subsequent chemical mechanical polishing (CMP) process will likely not be needed if spin-on material is used. Secondly, spin-on material such as photoresist is easy to work with using well known processes. In other embodiments, other materials may be used for the blanket mask layer 92 (e.g., an oxide, a nitride). When applying the blanket mask layer 92, the top silicon portion 78 may be exposed already, depending on the thickness of the blanket mask layer 92 initially. In such case, a step of removing part of the blank mask layer 92 (e.g., etching back) may not be needed.

Figure 15:
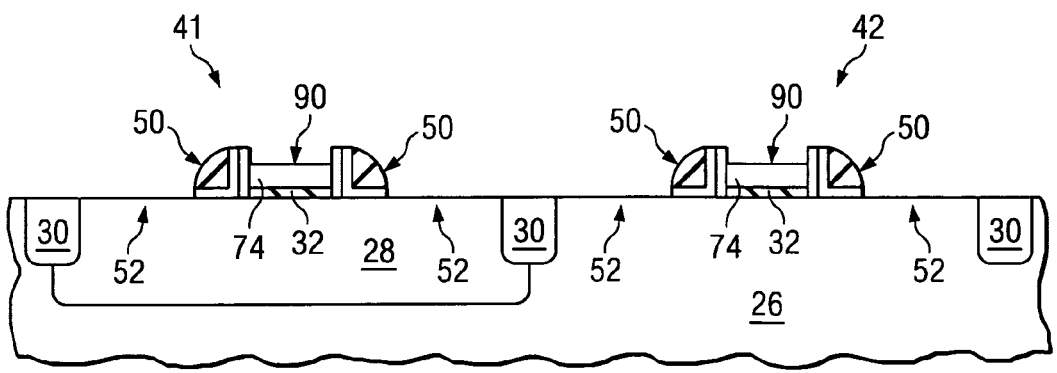

In FIG. 14, the top silicon portion 78 of the interim gate electrode stack 90 is removed. This may be done using the same etching process used to pattern the second silicon layer 78 (e.g., at FIG. 9). The etching of the top silicon portion 78 is stopped at the sandwiched oxide layer 76 (i.e., the patterned etch stop oxide layer 76), as discussed above regarding FIG. 9. Next, the sandwiched oxide layer 76 and the blanket mask layer 78 are removed, as shown in FIG. 15. This may be done using a photoresist strip, which may also remove the sandwiched oxide layer 76 along with the blanket mask layer 92. In addition or in alternative, an HF acid dip or an oxide etch chemistry may be used to remove the remainder of the sandwiched oxide layer 76. When removing the sandwiched oxide layer 76, it may also remove part of the spacer structure 50. Hence, removing the blanket mask layer 92 and/or removing the sandwiched oxide layer 76 may be used for simultaneously pulling down the spacer structure height to the full extent needed or to some extent.

In many cases, it will not be necessary to introduce a step just for removing the remainder of the sandwiched oxide layer 76 because a silicide pre-clean process may be sufficient to remove it. A silicide pre-clean will typically be done just before depositing the metal layer 58 to remove any oxide buildup and/or other build up on the surfaces of the interim gate electrode stack 90 and source/drain regions 52 that may interfere with the silicidation process. For example, to perform a nickel deposition for silicidation, the surface usually needs to be very clean for it to work properly.

Figure 16:
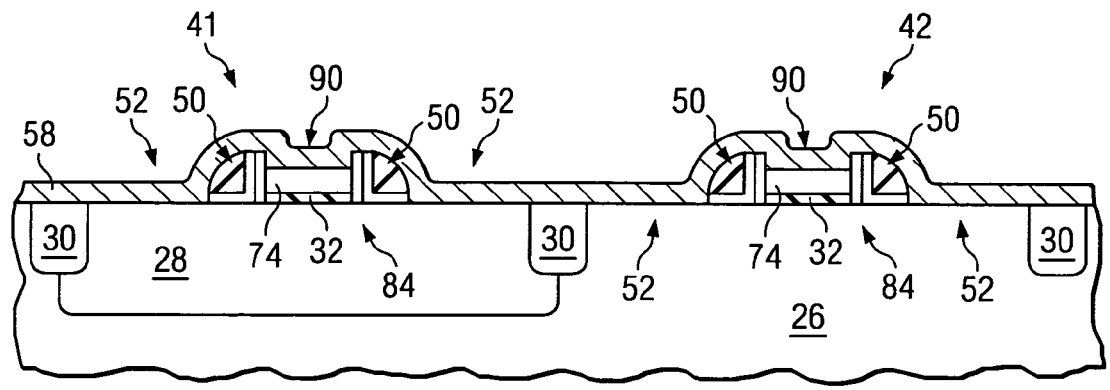

In FIG. 16, a metal layer 58 is formed over the bottom silicon portion 74 of the interim gate electrode stack 90 and over the source and drain regions 52 in preparation for the silicidation. It is preferred that the metal layer 58 is applied uniformly, but in other embodiments the metal layer 58 may not be applied uniformed (intentionally or inherently). The metal layer 58 may be formed from any suitable material, including (but not limited to): cobalt, nickel, hafnium, titanium, alloys thereof, or any combination thereof, for example. In a currently preferred embodiment, nickel is used for the metal layer 58. A nickel layer may be formed using a physical vapor deposition (PVD) process, for example, to provide a uniform or substantially uniform application of the metal layer 58. Because PVD is usually sensitive to the aspect ration of steps along a surface, it is preferred that the spacer structure 50 does not extend too high above the top surface of the bottom silicon portion 74 of the interim gate electrode stack 90. Ideally, the spacer structure 50 extends slightly above the bottom silicon portion 74 to better prevent bridging shorts (between gate electrode and source/drain regions 52) during the silicidation. A higher spacer structure height provides a greater margin against bridging shorts during silicidation and provides a more self-aligned silicidation process. The trade off, however, is that the metal layer 58 needs to be able to conform sufficiently over the spacer structure 50 to provide sufficient coverage with the metal layer 58 (i.e., in the corners). Thus, the spacer structure height or the amount of spacer structure pull down required may depend upon the metal material used for the metal layer 58 and upon the process used to form the metal layer 58 (e.g., PVD, CVD). For PVD of nickel, it is sometimes difficult to apply the nickel in narrow gaps having a high aspect ratio, for example.

Figure 17:
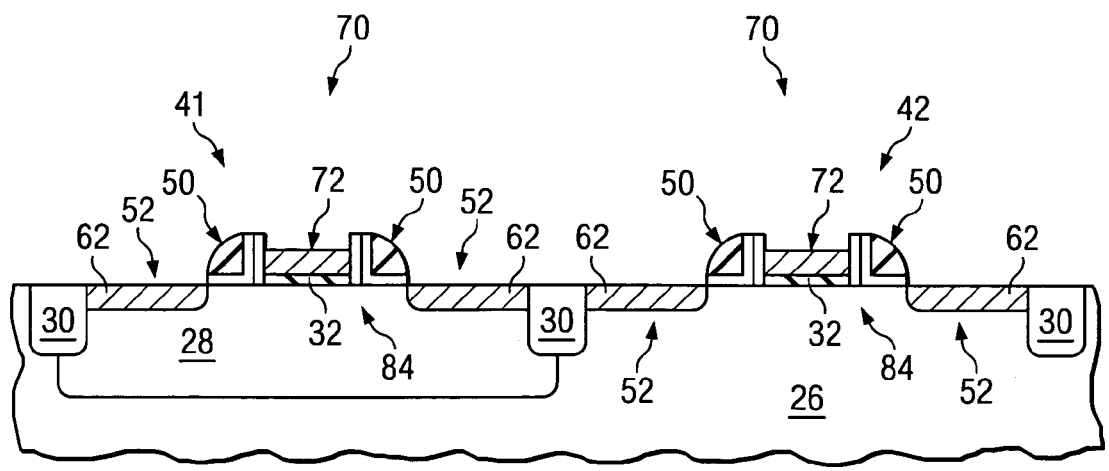

In FIG. 17, the bottom silicon portion 74 of the interim gate electrode stack 90 has been fully silicided to form a FUSI gate electrode 72. The metal layer 58 not consumed in the silicidation process has been removed in FIG. 17. Also in FIG. 17, the source and drain regions 52 have been silicided. In an embodiment of the present invention, the gate electrode 72 is fully silicided at the same time that the selected source and drain regions 52 (may or may not be all source and drain regions on the chip). This is preferred and advantageous for several reasons. First, additional and extra steps are not needed to fully silicide the gate electrode 72. Secondly, this simultaneous silicidation of the gate electrodes 72 and the selected source and drain regions 52 eliminates additional thermal budgets that would be need to silicide the gate electrode 72 separately. The source and drain regions 52 are sensitive to thermal budgets after their formation, especially another silicidation process. A second silicidation for the gate electrode, as is done in some FUSI processes, may cause unpredictable damage to the silicide at the source and drain regions 52. It may even change the physical and electrical properties of the silicide at the source and drain regions (e.g., NiSi changing to $NiSi_2$). $NiSi_2$ has a much higher resistance than NiSi.

Because the thickness of the silicide at the source and drain regions 52 is more critical than the thickness of the gate electrode 72, it is preferred to select the thickness of the first silicon layer 74 based on the desired silicide thickness at the source and drain regions 52. However, it is also desirable to obtain a fully silicided gate electrode 72, especially if the first silicon layer 74 is not doped (or not sufficiently doped) prior to silicidation. The preferred thickness of the first silicon layer 74 may be determined by the silicide thickness at the source and drain regions 52 in an existing or convention process (see e.g., FIG. 6).

Even though an embodiment of the present invention may be integrated into an existing process flow, it need not be. An embodiment of the present invention may be implemented or incorporated into a totally or mostly new process flow using new tooling, new spacer designs, new implantation procedures, or combinations thereof, for example.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming a silicon electrode comprising the steps of:
      forming a first silicon layer;
      forming an etch stop oxide layer on the first silicon layer;
      forming a second silicon layer on the etch stan layer;
      etching and patterning the second silicon layer to form the upper portion of the silicon electrode;
      stopping the etching of the second silicon layer at the etch stop oxide layer; and forming a sidewall spacer structure adjacent to sidewalls of the silicon electrode; removing an upper portion of the silicon electrode; and fully siliciding a remaining portion of the silicon electrode.

2. The method of claim 1, wherein the forming of the silicon electrode further comprises:
   removing portions of the etch stop oxide layer not covered by the patterned second silicon layer to expose at least part of the first silicon layer; and
   etching and patterning the first silicon layer to form the remaining portion of the silicon electrode.

3. A method of forming a semiconductor device, the method comprising:
   forming a silicon electrode comprising the steps of;
      forming a first silicon layer;
      forming an etch stop oxide layer on tire first silicon layer;
      etching and patterning the second silicon layer to form the upper portion of the silicon electrode;
      stopping the etching of the second silicon layer at the etch stop layer; forming a sidewall spacer structure; removing an upper portion of the silicon electrode comprising the steps of;
      etching the upper portion of the silicon electrode; and
      stopping the etching of the upper portion at the etch stop oxide layer; and fully siliciding a remaining portion of the silicon electrode.

4. The method of claim 1, further comprising forming a metal layer over the silicon electrode, wherein the metal layer is used for the fully siliciding of the silicon electrode.

5. The method of claim 4, further comprising siliciding selected source and drain regions of a substrate using the metal layer during the fully siliciding of the remaining portion of the silicon electrode, wherein the selected source and drain regions are adjacent to the spacer structure.

6. The method of claim 5, wherein the siliciding of the selected source and drain regions and of the silicon gate electrode is a self-aligned silicidation process.

7. The method of claim 1, further comprising reducing a height of the spacer structure prior to the fully siliciding of the remaining portion of the silicon electrode.

8. The method of claim 1, wherein the silicon electrode comprises an oxide layer sandwiched therein.

9. A method of forming a fully silicided gate electrode for a semiconductor device, the method comprising:
   forming a first silicon layer on a gate dielectric layer, the gate dielectric layer being formed over a substrate;
   forming an etch stop oxide layer on the first silicon layer;
   forming a second silicon layer on the etch stop oxide layer;
   etching and patterning the second silicon layer to form a top silicon portion of an interim gate electrode stack, the top silicon portion having a top portion gate length dimension;
   stopping the etching of the second silicon layer at the etch stop oxide layer;
   removing portions of the etch stop oxide layer not covered by the patterned second silicon layer to expose at least part of the first silicon layer, to form a patterned stop oxide layer under the patterned second silicon layer, and to form a sandwiched oxide portion of interim gate electrode stack;
   etching and patterning the first silicon layer to form a bottom silicon portion of the interim gate electrode stack and to complete the formation of the interim gate electrode stack, the bottom silicon portion having a bottom portion gate length dimension, wherein the bottom portion gate length is about the same as the top portion gate length, and wherein the interim gate electrode stack includes the sandwiched oxide portion located between the top silicon portion and the bottom silicon portion;
   forming a spacer structure about the interim gate electrode stack;
   after forming the spacer structure, etching to remove the top silicon portion of the interim gate electrode stack;
   stopping the etching to remove the top silicon portion at the sandwiched oxide portion of the interim gate electrode stack;
   removing the sandwiched oxide portion of the interim gate electrode stack;
   forming a metal layer over the bottom silicon portion of the interim gate electrode stack;
   forming the metal layer over selected source and drain regions of the substrate;
   siliciding the bottom silicon portion of the interim gate electrode stack using the metal layer to form the fully silicided gate electrode; and
   siliciding the selected source and drain regions of the substrate using the metal layer while siliciding the bottom silicon portion of the interim gate electrode stack.

10. A method of making an integrated circuit chip comprising the method of claim 9.

11. The method of claim 9, wherein the first silicon layer is polycrystalline silicon.

12. The method of claim 11, wherein the forming of the first silicon layer occurs in a chemical vapor deposition tool.

13. The method of claim 11, wherein the second silicon layer is polycrystalline silicon.

14. The method of claim 9, wherein the forming of to first silicon layer, the forming of the etch stop oxide layer, and the forming of the second silicon layer are formed in-situ using a same tool.

15. The method of claim 9, wherein the second silicon layer is thicker than the first silicon layer.

16. The method of claim 9, further comprises implanting at least part of the selected source drain regions of the substrate in alignment with at least part of the spacer structure.

17. The method of claim 9, further comprises removing part of the spacer structure to reduce the height of the spacer structure such that at least part of the top silicon portion of the interim gate electrode stack extends above the spacer structure.

18. The method of claim 17, wherein after the step of removing part of the spacer structure to reduce the height of the spacer structure, the height of the spacer structure is above the bottom silicon portion of the interim gate electrode stack.

19. The method of claim 9, further comprises:
forming a blanket mask layer over the substrate after the forming of the spacer structure, wherein the blanket mask layer comprises a spin-on material;
removing a portion of the blanket mask layer so that a top surface of the top silicon portion of the interim gate electrode stack is exposed; and
removing the blanket mask layer after the etching to remove the top silicon portion of the interim gate electrode stack.

20. The method of claim 9, wherein the first silicon layer has a thickness in a range of about 200 angstroms to about 300 angstroms.

21. The method of claim 9, wherein the etch stop oxide layer has a thickness in a range of about 10 angstroms to about 50 angstroms.

22. The method of claim 9, wherein the interim gate electrode stack has a thickness of less than about 1000 angstroms.

23. The method of claim 9, wherein the etch stop oxide layer comprise a silicon oxide material.

24. The method of claim 9, wherein the metal layer comprises a metal selected from a group consisting of nickel, cobalt, titanium, hafnium, alloys thereof, and combinations thereof.

25. The method of claim 9, wherein the first silicon layer has a thickness selected so that the bottom silicon portion of the interim gate electrode stack is fully silicided at about the same time as a desired suicide thickness is formed in selected source and drain regions of the substrate.

26. The method of claims 9, wherein the siliciding of the bottom silicon portion of the interim gate electrode stack and the siliciding of the selected source and drain regions of the substrate are self-aligned siliciding.

27. A method of forming a fully silicided gate electrode for a semiconductor device, the method comprising
forming a first polysilicon layer on a gate dielectric layer, the gate dielectric layer being formed on a substrate;
forming an etch stop oxide layer on the first polysilicon layer;
etching a second polysilicon layer on the etch stop oxide layer;
etching and patterning the second polysilicon layer to form a top polysilicon portion of an interim gate electrode stack, the top polysilicon portion having a top portion gate length dimension;
stopping the etching of the second polysilicon layer at the etch stop oxide layer;
removing portions of the etch stop oxide layer not covered by the patterned second silicon layer to expose at least part of the first silicon layer, to form a patterned stop oxide layer under the patterned second silicon layer, and to form a sandwiched oxide portion of interim gate electrode stack;
etching and patterning the first polysilicon layer to form a bottom polysilicon portion of the interim gate electrode stack and to complete the formation of the interim gate electrode, the bottom polysilicon portion having a bottom portion gate length dimension, wherein the bottom portion gate length is about the seine as the top portion gate length, and wherein the interim gate electrode stack includes the sandwiched oxide portion located between the top polysilicon portion and the bottom polysilicon portion;
forming a spacer structure about the interim gate electrode stack;
after forming the spacer structure, etching to remove the top polysilicon portion of the interim gate electrode stack;
stopping the etching to remove the top polysilicon portion at the sandwiched oxide portion of the interim gate electrode stack;
removing the sandwiched oxide portion of the interim gate electrode stack;
forming a metal layer over the bottom polysilicon portion of the interim gate electrode stack;
forming the metal layer over selected source and drain regions of the substrate;
siliciding the bottom polysilicon portion of the interim gate electrode stack using the metal layer to form the filly silicided gate electrode; and
siliciding the selected source and drain regions of the substrate using the metal layer while siliciding the bottom polysilicon portion of the interim gate electrode stack, wherein the first polysilicon layer has a thickness selected so that the bottom polysilicon portion of the interim gate electrode stack is fully silicided at about the same time as a desired suicide thickness is formed in selected source and drain regions of the substrate.

28. A method of making an integrated circuit chip comprises forming fully silicided gate electrodes, the forming of gate electrodes comprising:
forming a first layer of silicon on a gate dielectric layer, the gate dielectric layer being formed over a substrate;
forming an etch stop oxide layer on the first silicon layer,
forming a second layer of silicon on the etch stop oxide layer;
forming a patterned mask over the second silicon layer;
etching and patterning the second silicon layer in alignment with the patterned mask;
stopping the etching of the second silicon layer at the etch stop oxide layer;
removing portions of the etch stop oxide layer not covered byte patterned second silicon layer to expose at least part of the first silicon layer and to form a patterned etch stop oxide layer under the patterned second silicon layer;

etching and patterning the first silicon layer in alignment with the patterned second silicon layer to form a set of interim gate electrode stacks comprising at least part of the patterned second silicon layer, at least part of the patterned etch stop oxide layer, and at least part of the patterned first silicon layer;

forming a spacer structure about each of at least some of the interim gate electrode stacks;

after the forming of the spacer structure, etching to remove the patterned second silicon layer and stopping at the patterned etch stop oxide layer;

removing the patterned etch stop oxide layer;

forming a metal layer over a top surface of the patterned first silicon layer and over selected source and drain regions of the substrate;

siliciding the portions of the patterned first silicon layer in the interim gate electrode stacks using the metal layer to form the fully silicided gate electrodes; and siliciding the selected source and drain regions of the substrate using the metal layer while siliciding the patterned first silicon layer of the interim gate electrode stacks.

29. The method of claim 28, wherein the first silicon layer is polycrystalline silicon and wherein the second silicon layer is polycrystalline silicon.

30. The method of claim 29, wherein the forming of the first and second silicon layers occurs in a chemical vapor deposition tool.

31. The method of claim 28, wherein the forming of the first silicon layer, the forming of the etch stop oxide layer, and the forming of the second silicon layer are formed in-situ using a same tool.

32. The method of claim 28, wherein the second silicon layer is thicker than the first silicon layer.

33. The method of claim 28, further comprises implanting at least some of the selected source and drain regions of the substrate in alignment with the spacer structure.

34. The method of claim 28, further comprises removing pan of the spacer structure to reduce the height of the spacer structure such that at least part of the patterned second silicon layer of the interim gate electrode stacks extends above the spacer structure.

35. The method of claim 28, wherein after the step of removing part of the spacer structure to reduce the height of the spacer structure, the height of the spacer structure is above the top surface of the first silicon layer.

36. The method of claim 34, wherein after the step of removing part of the spacer structure to reduce the height of the spacer structure, the height of the spacer structure is below the top surface of the first silicon layer.

37. The method of claim 28, further comprises:

forming a blanket mask layer over the substrate after the forming of the spacer structure;

removing a portion of the blanket mask layer so that a top surface of the patterned second silicon layer is exposed; and removing the blanket mask layer after the etching to remove the patterned second silicon layer.

38. The method of claim 37, wherein the blanket mask layer comprises a spin-on material.

39. The method of claim 37, wherein at least part of the patterned etch stop oxide layer is removed during the removing of the blanket mask layer.

40. The method of claim 28, further comprises removing the metal layer after the siliciding.

41. The method of claim 28, wherein the first silicon layer has a thickness in a range of about 200 angstroms to about 300 angstroms.

42. The method of claim 28, wherein the etch stop oxide layer has a thickness in a range of about 10 angstroms to about 50 angstroms.

43. The method of claim 28, wherein the interim gate electrode stacks have a thickness of less than about 1000 angstroms.

44. The method of claim 43, wherein the interim gate electrode stacks have a thickness in a range of about 800 angstroms to about 900 angstroms.

45. The method of claim 28 wherein the etch stop oxide layer comprise a silicon oxide material.

46. The method of claim 28, wherein the metal layer comprises a metal selected from a group consisting of nickel, cobalt, titanium, hafnium, alloys thereof, and combinations thereof.

* * * * *

UNITED STATES PATENT AND TRADEMARK OFFICE
CERTIFICATE OF CORRECTION

PATENT NO. : 7,235,472 B2
APPLICATION NO. : 10/988113
DATED : June 26, 2007
INVENTOR(S) : Klee et al.

It is certified that error appears in the above-identified patent and that said Letters Patent is hereby corrected as shown below:

In Col. 1, line 30, delete "lead" and insert --led--.
In Col. 2, line 5, delete "lead" and insert --led--.
In Col. 2, line 21, delete "formation" and insert --formation of--.
In Col. 2, line 26, delete "to" and insert --to be--.
In Col. 5, line 53, delete "pattern" and insert --patterned--.
In Col. 6, line 46, delete "know" and insert --known--.
In Col. 9, line 66, delete "ore" and insert --or--.
In Col. 10, line 13, delete "predicable" and insert --predictable--.
In Col. 10, line 28, delete "this" and insert --this is--.
In Col. 10, line 28, delete "example" and insert --example of a--.
In Col. 10, line 31, delete "implement" and insert --implemented--.
In Col. 12, line 6, delete "uniformed" and insert --uniformly--.
In Col. 12, line 27, delete "comers" and insert --corners--.
In Col. 12, line 47, delete "be need" and insert --be needed--.
In Col. 13, line 35, delete "stan" and insert --stop--.
In Col. 13, line 56, delete "tire" and insert --the--.
In Col. 15, line 7, delete "to" and insert --the--.
In Col. 15, line 56, delete "suicide" and insert --silicide--.
In Col. 16, line 1, delete "etching" and insert --forming--.
In Col. 16, line 20, delete "seine" and insert --same--.
In Col. 16, line 41, delete "filly" and insert --fully--.
In Col. 16, line 48, delete "suicide" and insert --silicide--.
In Col. 16, line 64, delete "byte" and insert --by the--.
In Col. 17, line 39, delete "pan" and insert --part--.

Signed and Sealed this

Twenty-third Day of September, 2008

JON W. DUDAS
*Director of the United States Patent and Trademark Office*